United States Patent
Reber et al.

(10) Patent No.: US 9,318,409 B1
(45) Date of Patent: Apr. 19, 2016

(54) INTEGRATED CIRCUIT HEATER FOR REDUCING STRESS IN THE INTEGRATED CIRCUIT MATERIAL AND CHIP LEADS OF THE INTEGRATED CIRCUIT, AND FOR OPTIMIZING PERFORMANCE OF DEVICES OF THE INTEGRATED CIRCUIT

(71) Applicants: Douglas M. Reber, Austin, TX (US);
 Mehul D. Shroff, Austin, TX (US);
 Edward O. Travis, Austin, TX (US)

(72) Inventors: Douglas M. Reber, Austin, TX (US);
 Mehul D. Shroff, Austin, TX (US);
 Edward O. Travis, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/496,870

(22) Filed: Sep. 25, 2014

(51) Int. Cl.
 *H01L 21/66* (2006.01)
 *H01L 23/34* (2006.01)

(52) U.S. Cl.
 CPC .................................... *H01L 23/345* (2013.01)

(58) Field of Classification Search
 CPC ......... H01L 23/36; H01L 22/34; H01L 22/14; H01L 22/32; H01L 22/12
 USPC ............................................................ 428/18
 See application file for complete search history.

(56) References Cited

U.S. PATENT DOCUMENTS

| | | | |
|---|---|---|---|
| 3,411,049 A | 11/1968 | Trincossi et al. | |
| 4,481,403 A * | 11/1984 | Del Monte | 219/209 |
| 5,305,451 A * | 4/1994 | Chao et al. | 713/500 |
| 5,873,053 A | 2/1999 | Pricer et al. | |
| 5,920,808 A | 7/1999 | Jones et al. | |
| 6,046,433 A | 4/2000 | Gross et al. | |
| 2002/0158652 A1* | 10/2002 | Okayasu | 324/765 |
| 2007/0029665 A1* | 2/2007 | Lee et al. | 257/712 |

* cited by examiner

*Primary Examiner* — Quoc Hoang

(57) ABSTRACT

A device comprising a first detector, comprising an output, disposed at a first location of an integrated circuit chip and configured to determine a first temperature information, a chip heater, comprising an input to receive a control signal, disposed at a second location of the integrated circuit and configured to heat an area of the integrated circuit device that includes the first location and the second location, based upon the control signal, and a heater controller comprising a first input coupled to the output of the first detector to receive the first temperature information, and an output coupled to the input of the chip heater, the heater controller configured to generate the control signal based upon the first temperature information.

20 Claims, 9 Drawing Sheets

INTEGRATED CIRCUIT HEATER FOR REDUCING STRESS IN THE INTEGRATED CIRCUIT MATERIAL AND CHIP LEADS OF THE INTEGRATED CIRCUIT, AND FOR OPTIMIZING PERFORMANCE OF DEVICES OF THE INTEGRATED CIRCUIT

FIELD OF THE DISCLOSURE

This disclosure generally relates to integrated circuits, and more particularly relates to heating integrated circuits.

BACKGROUND

In operation, an integrated circuit formed at a die, also referred to as a chip, generates heat. The heat generated can be unevenly distributed across the chip. Such uneven heat distribution can be evidenced by a large temperature difference between different portions of the chip, or by a large temperature gradient at various portions of the chip. The operating characteristics of the devices implemented on a particular chip may be sensitive to differences in temperature, such that a device that is implemented in a relatively hotter portion of the chip may perform differently than an identically laid out copy of the device that is implemented in a relatively cooler portion of the chip. Such differences in performance may necessitate design criteria that include wide tolerances for such characteristics as circuit timings or power delivery. Moreover, large temperature gradients in the chip may result in large mechanical stresses within the chip or within attachment mechanisms between the chip and an associated chip carrier, resulting in premature device failure. The problems associated with large temperature differences and large temperature gradients in a chip are compounded when two or more chips are stacked together into a three-dimensional (3D) array.

There is therefore a need to provide more even temperatures and for lower temperature gradients across a chip or within a 3D array of chips.

BRIEF DESCRIPTION OF THE DRAWINGS

The present disclosure may be better understood, and its numerous features and advantages made apparent to those skilled in the art by referencing the accompanying drawings, wherein.

The use of the same reference symbols in different drawings indicates similar or identical items.

DETAILED DESCRIPTION OF THE DRAWINGS

An integrated circuit device includes a chip carrier and an integrated circuit chip. In operation, circuitry that implements the intended function of the chip generates heat unevenly across the chip, resulting in areas with high thermal gradients or large differences in temperature. High thermal gradients and large temperature differences in the chip are mitigated by providing chip heaters that are operated to heat cooler areas of the chip. In this way, thermal stresses within the chip and in the chip leads that connect the chip to the chip carrier are reduced, and performance of circuits within the chip are more predictable. Chip heaters are also provided for 3D integrated circuits to reduce the stresses within the chips of the 3D integrated circuit and within the chip leads that connect the chips to each other and to a chip carrier. Cells representing a particular circuit of the chip can be laid out to optimize performance when placed in a hotter thermal area of the chip. Instantiations of the cells that are placed in colder thermal area of the chip can be collocated with chip heaters in order to improve their performance.

Figure 1:
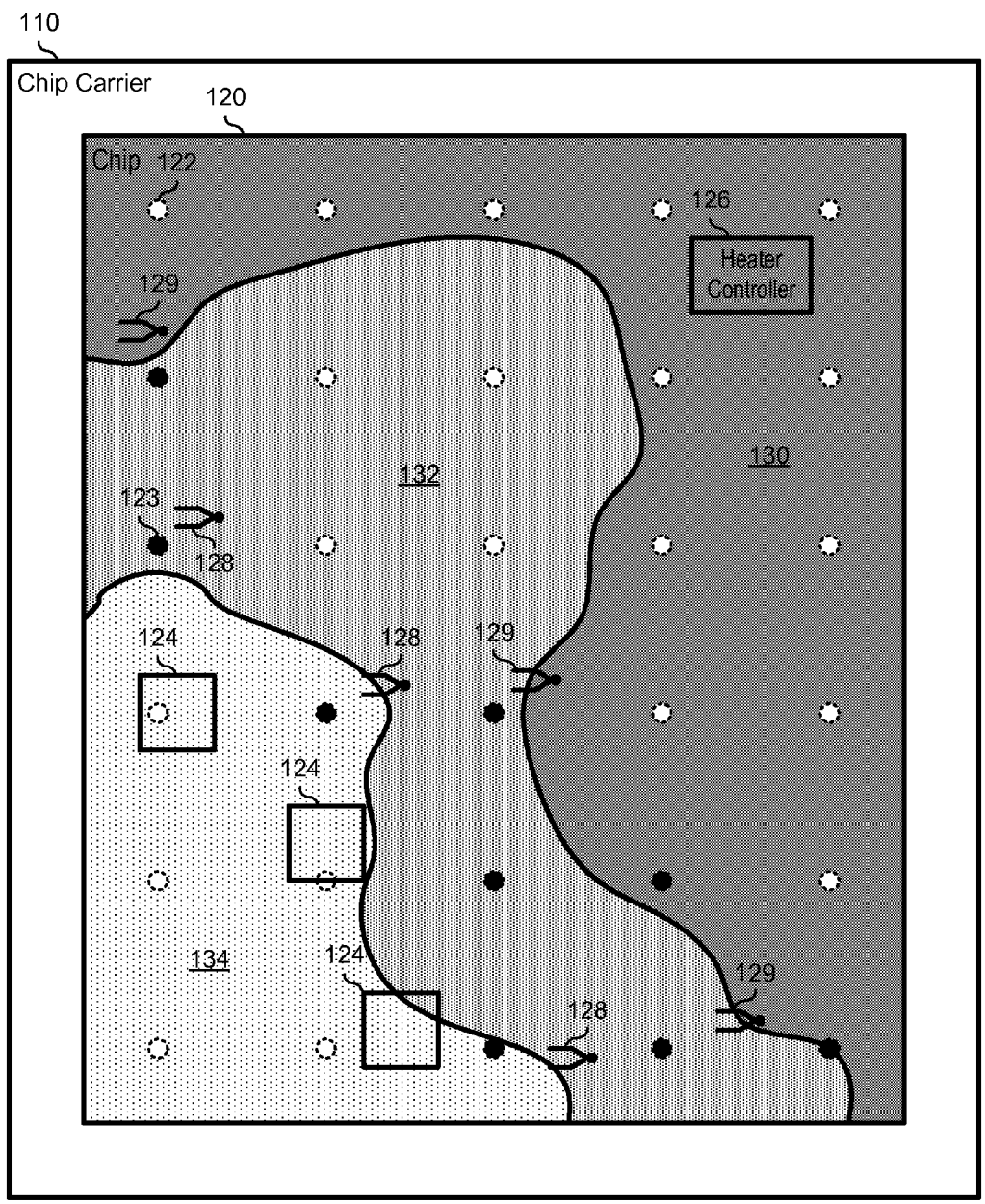
FIGS. 1 and 2 illustrate an integrated circuit device with chip heaters, according to an embodiment of the present disclosure.

FIG. 1 illustrates an integrated circuit device 100, according to an embodiment of the present disclosure, including a chip carrier 110 and an integrated circuit chip 120. Chip carrier 110 represents a package configured to provide a mechanical package for housing chip 120 and providing electrical connectivity between the chip and an external device or system configured to employ the functions and features of integrated circuit device 100. As such, chip carrier 110 can represent a wide variety of integrated circuit packaging technologies such as through-hole packages, surface mount packages, leaded or leadless chip carrier packages, pin- or ball-grid array packages, or other packages, as are known in the art.

Chip 120 represents an integrated circuit configured to provide an electrical or electronic function to an external device or system. As such, chip 120 can represent a wide variety of integrated circuits including general- or specific-purpose data processing circuits such as a central processing unit (CPU), a memory device, a programmable gate array (PGA), an embedded microcontroller or system-on-a-chip (SoC), or other data processing circuit, general- or specific-purpose analog circuits such as an amplifier or amplifier block, a phase-locked-loop (PLL), a radio transmitter/receiver, or other analog circuit, a mixed analog/digital circuit, a power circuit, or other type of integrated circuit, as needed or desired. Moreover, chip 120 can represent an integrated circuit constructed from a wide variety of semi conductor manufacturing processes and materials as are known in the art.

Chip 120 is connected to chip carrier 110, both mechanically and electrically, via a number of chip leads 122 and 123. Chip leads 122 and 123 represent a wide variety of connection mechanisms, such as solder bumps, copper pillars, through silicon (Si) vias (TSVs), or other mechanical or electrical connection mechanisms for connecting an integrated circuit chip to a chip carrier, as are known in the art. Chip leads 122 and 123 typically share a common connection mechanism. Here, chip leads 122 are illustrated as white circles, indicating that chip leads 122 are under less mechanical stress than chip leads 123, which are illustrated as black circles, as described further below.

Chip 120 includes one or more chip heaters 124. Chip heaters 124 represent portions of the integrated circuit design of chip 120 that are placed at various locations in the chip design and whose function is to heat an area of the chip that is proximate to the chip heater. As such, chip heaters 124 can be implemented as any integrated circuit design feature that produces heat as a byproduct of its operation. In a particular embodiment, chip heaters 124 are implemented as passive devices of the integrated circuit design. For example, one or more of chip heaters 124 can be implemented as a resistor or inductor of the integrated circuit design or another passive device of the integrated circuit design. Here, the passive device can be fabricated onto chip 120 as a thin-film resistor, a metal layer inductor, or another passive device that is fabricated onto the chip. In another embodiment, chip heaters 124 are implemented as active circuits of the integrated circuit, such as switched capacitor circuits for alternately charging and discharging capacitors of the integrated circuit design, functional blocks of the integrated circuit design, such as counters, dummy clock trees, or other functional blocks of the integrated circuit, or other integrated circuit design features that produce heat. Further, each of chip heaters 124 can represent a different heating mechanism, as needed or desired.

Chip 120 also includes a heater controller 126 and one or more detectors 128 and 129. Heater controller 126 represents a portion of the integrated circuit design of chip 120 whose function is to determine when the operating conditions on the chip warrant the operation of one or more of chip heaters 124, and to control the operation of the chip heaters. As such, heater controller 126 receives information regarding the operating temperatures on chip 120 from detectors 128 and 129. Detectors 128 and 129 represent portions of the integrated circuit design of chip 120 that operate to detect the operating temperature of an area of the chip that is proximate to the detector. In a particular embodiment, detectors 128 and 129 represent temperature sensors that directly detect the operating temperatures, such as where the detectors represent thermocouples or other devices for directly detecting operating temperatures. In another embodiment, detectors 128 and 129 operate to indirectly detect the operating temperatures, such as where the detectors represent power detectors that detect the power consumed by portions of the integrated circuit design of chip 120 that are proximate to the detectors. Here, heater controller 126 operates to correlate the detected power consumption from detectors 128 and 129 with the temperature of the respective portions of chip 120.

Heater controller 126 further operates to activate one or more of chip heaters 124 based upon the operating temperature information received from pairs of detectors 128 and 129. For example, heater controller 126 can include a temperature gradient circuit to determine when a temperature gradient between pairs of detectors is greater than a temperature gradient threshold and to activate chip heaters 124 when the temperature gradient exceeds the temperature gradient threshold. In this embodiment, heater controller 126 activates chip heaters 124 based upon temperature gradients across chip 120, as determined by combining the operating temperature information from a first detector 128 and one or more second detectors 129. FIG. 1 illustrates chip 120 as exhibiting a temperature profile represented by thermal regions 130, 132, and 134. Here, thermal region 130 represents an area of chip 120 that has a relatively higher temperature than thermal regions 132 and 134, thermal region 134 represents an area of the chip that has a relatively lower temperature than regions 130 and 132, and thermal region 132 represents an area of the chip that has a relatively medium temperature between the temperature of thermal region 130 and the temperature of thermal region 134. Thermal region 130 can represent portions of chip 120 that have more active components in the integrated circuit design, such as high-speed switching, clock generation circuits or the like, while thermal region 134 can represent portions of the chip that have less active components in the integrated circuit design, such as analog circuits, I/O circuits, or the like. Here, chip heaters 124 are shown as being deactivated, but detector pairs 128/129 indicate that thermal region 132 has a narrow profile, that is, a high thermal gradient, between thermal regions 130 and 134 in the areas indicated by chip leads 123 (shown as black circles).

The skilled artisan will recognize that the semiconductor material of chip 120 has a particular coefficient of thermal expansion (CTE) that is determined by the type of the semiconductor material, and that at a particular portion of the chip, the amount of thermal expansion within the semiconductor material is correlated by the CTE to the temperature of that portion of the chip. Thus, at the narrow profile areas of thermal region 132, the amount of thermal expansion within chip 120 is changing rapidly, leading to high stress within the semiconductor material of the chip, while at the wider profile areas of thermal region 132 and across thermal regions 130 and 134, the amount of thermal expansion changes more gradually across the chip, and the semiconductor material experiences less stress. As such, the narrow profile areas of thermal region 132 experience greater stress within the semiconductor material, increasing the risk that chip 120 could crack in the narrow profile areas. Further, chip leads 123 likewise experience different amounts of stress, increasing the risk that one or more of chip leads 123 could fail.

Figure 2:
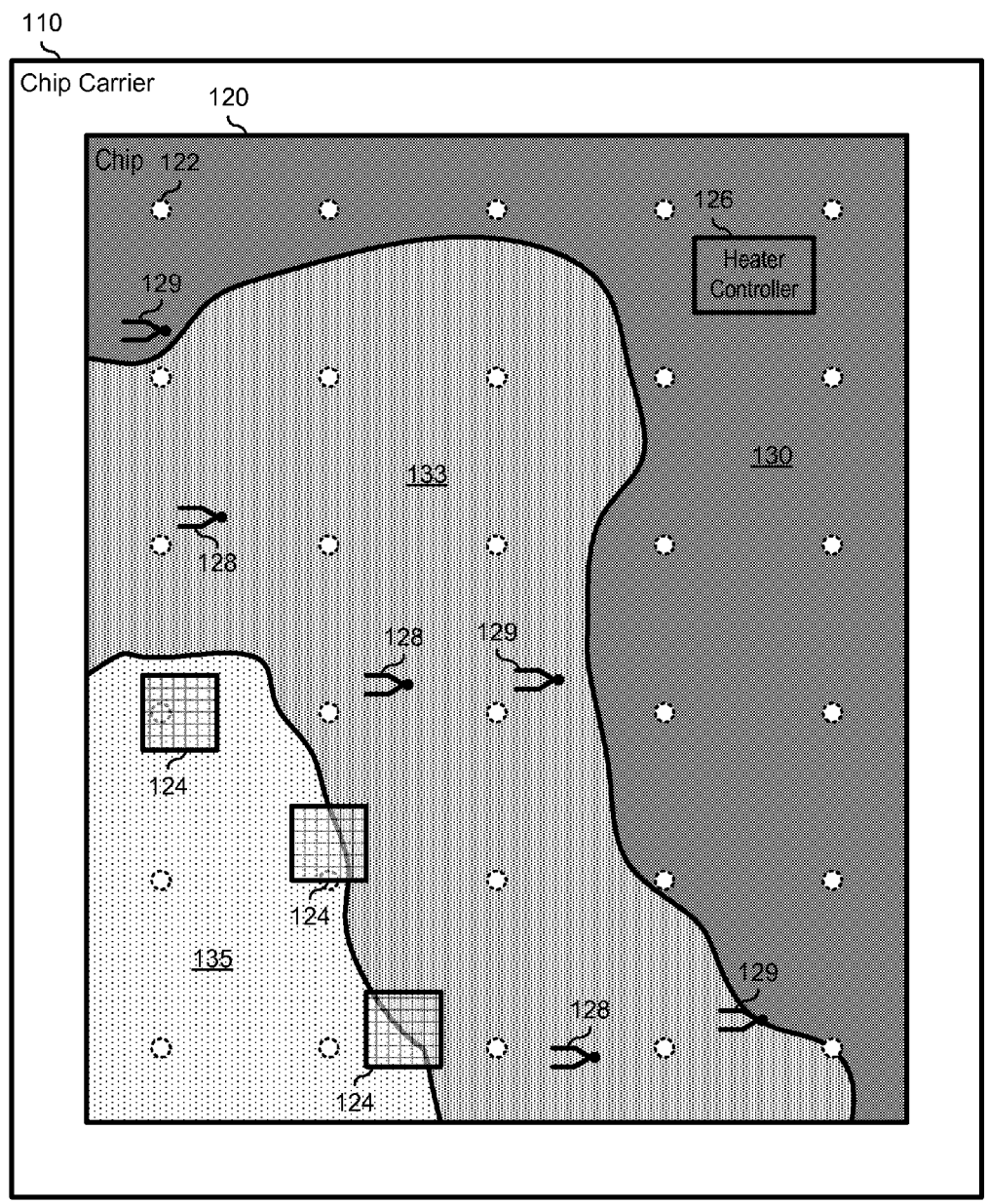

FIG. 2 illustrates integrated circuit device 100 where heater controller 126 has activated one or more of chip heaters 124, as indicated by the cross-hatch pattern in the chip heaters, in response to the information from detector pairs 128/129 that thermal region 132 had narrow profiles between thermal regions 130 and 134. Here, chip heaters 124 operate to heat the areas of chip 120 that are proximate to the chip heaters. As such, the heat generated from chip heaters 124 is provided to chip 120 in addition to the heat generated by the other elements of the integrated circuit design that are also proximate to the chip heaters. In this way, the size of a lower temperature thermal region 135 is decreased over the size of prior lower temperature thermal region 134, the size of a medium temperature thermal region 133 is increased over the size of prior medium temperature thermal region 132. Thus the temperature gradient between thermal regions 130, 133, and 135 is decreased, as is the likelihood that chip 120 will be subject to cracking. Further, chip leads 122 are all illustrated as being under less mechanical stress due to the decreased temperature gradient that resulted from activating chip heaters 124.

In a particular embodiment, heater controller 126 operates to maintain chip heaters 124 in the active state until one or more of detector pairs 128/129 provides information indicating that the thermal gradient in chip 120 has been decreased to within a particular tolerance. For example, heater controller 126 can operate to keep the thermal gradient across chip 120 to a value that is less than 1.2° C./mm (millimeter) across the chip. In another embodiment, heater controller 126 operates to implement a management scheme in order to maintain the desired thermal gradient across chip 120. For example, heater controller 126 can activate one or more of chip heaters 124 via a pulse-width-modulated (PWM) activation signal, such that the chip heaters can be controlled to provide a heating level that more closely matches the needs of chip 120, as indicated by detectors 128 and 129. In particular, heater controller 126 can provide for a particular heater to have a duty cycle of between 0 and 100%, and can dynamically activate chip heaters such that an area of chip 120 that lies between the activated chip heaters is provided with more heat than other areas of the chip, as needed or desired. In another example, heater controller 126 can perform one or more signal processing tasks on the information provided from detectors 128 and 129 to provide a finer grained control operation, such as by performing a fast Fourier transform (FFT) on the information and thereby smoothing out the heating function provided by chip heaters 124.

Figure 3:
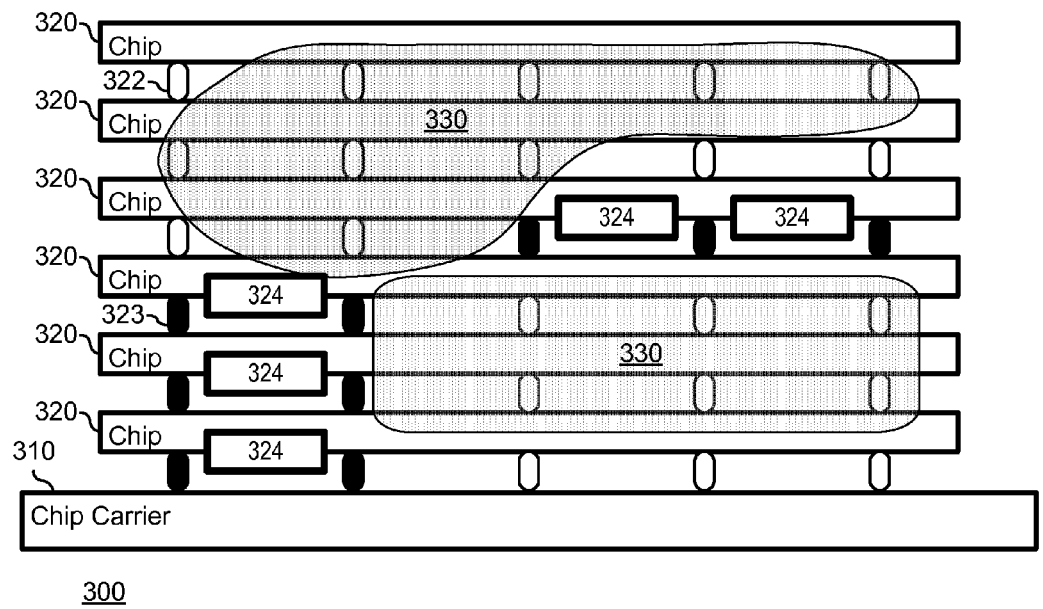
FIGS. 3 and 4 illustrate a 3D integrated circuit device with chip heaters, according to an embodiment of the present disclosure.

FIG. 3 illustrates a 3D integrated circuit device 300 according to an embodiment of the present disclosure, including a chip carrier 310 and two or more chips 320. Chip carrier 310 is similar to chip carrier 110 and is configured to provide a mechanical package for housing chips 320 and providing electrical connectivity between the chips and an external device or system configured to employ the functions and features of integrated circuit device 300. Chips 320 are similar to chip 120, and represent integrated circuits configured to provide electrical or electronic functions to the external device or system. Chips 320 are connected to chip carrier 310 and to each other, both mechanically and electrically, via a number of chip leads 322 and 323. Here, chip leads 322 are illustrated as white circles, indicating that chip leads 322 are under less mechanical stress than chip leads 323, which are illustrated as black circles.

One or more of chips 320 include one or more chip heaters 324 similar to chip heaters 124, and that each represent a portion of the integrated circuit design of the respective chip, and whose function is to heat an area of the respective chip that is proximate to the chip heater, and to heat areas of adjacent chips. Here, one or more of chips 320 include a heater controller (not shown) similar to heater controller 126 and one or more detectors (not shown) similar to detectors 128 and 129. The heater controller represents a portion of the integrated circuit design of the respective chip 320 whose function is to determine when the operating conditions on the chips warrant the operation of one or more of chip heaters 324, and to control the operation of the chip heaters. As such, the heater controller receives information regarding the operating temperatures on chips 320 from the detectors. The detectors represent portions of the integrated circuit design of chips 320 that operate to detect the operating temperature of areas of the chips that are proximate to the detectors.

The heater controller further operates to activate one or more of chip heaters 324 based upon the operating temperature information received from the detectors. FIG. 3 illustrates chips 320 as exhibiting higher temperatures, represented by thermal regions 330, where the thermal region represents areas of 3D integrated circuit device 300 that are relatively hotter than the rest of the 3D integrated circuit device, or, alternatively, that other areas of the 3D integrated circuit device are relatively cooler than thermal region 330. Here, chip heaters 324 are shown as being deactivated. Here, the areas that are relatively cooler may experience greater stress within the semiconductor material, increasing the risk that one or more of chips 320 could crack. Further, chip leads 323 likewise experience greater stress, increasing the risk that one or more of chip leads 323 could fail.

Figure 4:
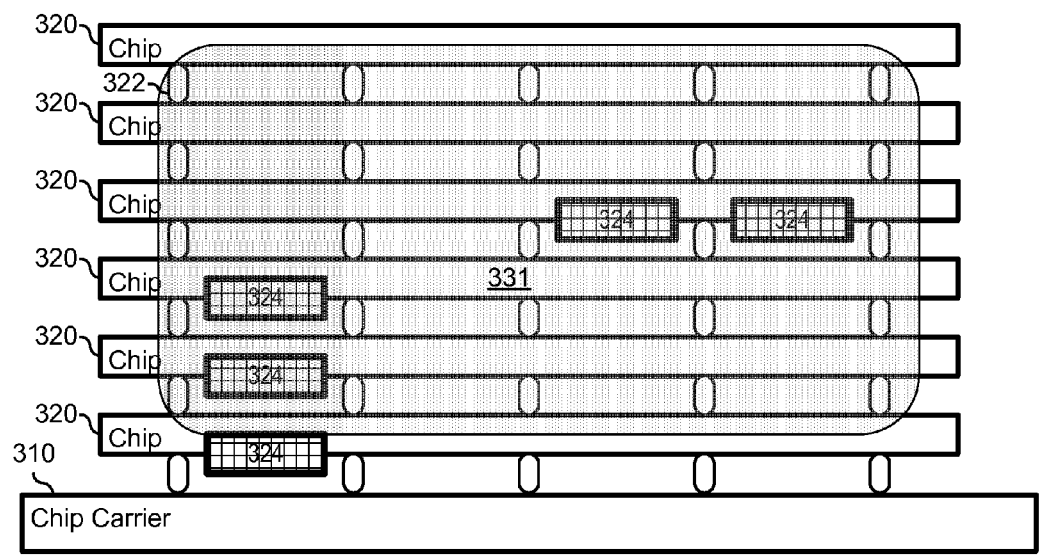

FIG. 4 illustrates 3D integrated circuit device 300 where the heater controller has activated one or more of chip heaters 324, as indicated by the cross-hatch pattern in the chip heaters, in response to the information from the detectors that thermal region 330 is relatively hotter than the rest of the 3D integrated circuit device. Here, chip heaters 324 operate to heat the areas of chips 320 that are proximate to the chip heaters. As such, the heat generated from chip heaters 324 is provided to chips 320 in addition to the heat generated by the other elements of the integrated circuit design that are also proximate to the chip heaters. In this way, a more homogeneous thermal region 331 is created. Thus the temperature gradient between chips 320 is decreased, as is the likelihood that one or more of chips 320 will be subject to cracking. Further, chip leads 322 are all illustrated as being under less mechanical stress due to the decreased temperature gradient that resulted from activating chip heaters 324.

Figure 5:
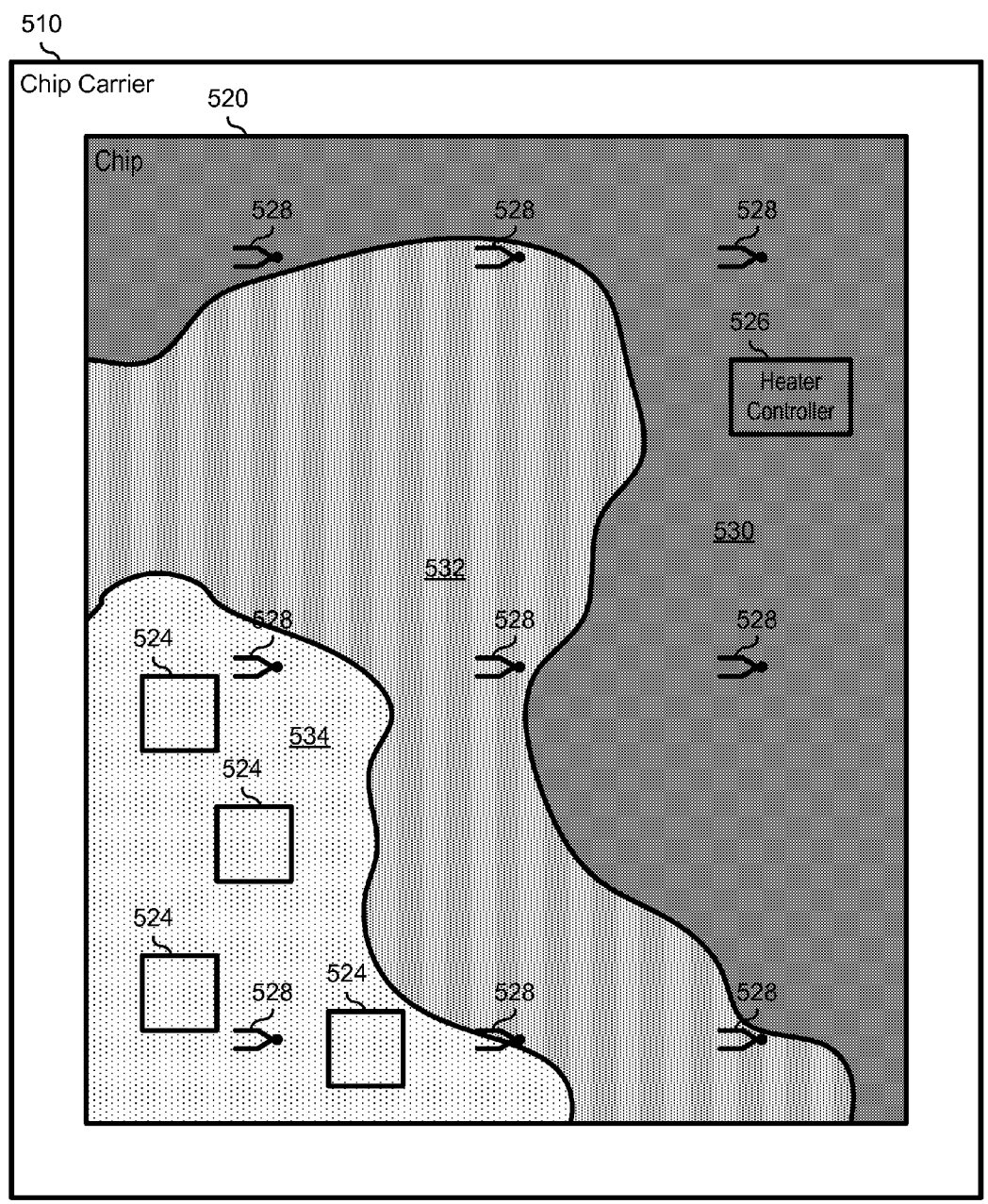
FIGS. 5 and 6 illustrate an integrated circuit device with chip heaters, according to another embodiment of the present disclosure.

FIG. 5 illustrates an integrated circuit device 500, similar to integrated circuit device 100, including a chip carrier 510 and an integrated circuit chip 520. Chip carrier 510 represents a package configured to provide a mechanical package for housing chip 520 and providing electrical connectivity between the chip and an external device or system configured to employ the functions and features of integrated circuit device 500. Chip 520 represents an integrated circuit configured to provide an electrical or electronic function to the external device or system. Chip 520 includes one or more chip heaters 524. Chip heaters 524 represent a portion of the integrated circuit design of chip 520 whose function is to heat an area of the chip that is proximate to the chip heater.

Chip 520 also includes a heater controller 526 and one or more detectors 528. Heater controller 526 represents a portion of the integrated circuit design of chip 520 whose function is to determine when the operating conditions on the chip warrant the operation of one or more of chip heaters 524, and to control the operation of the chip heaters. As such, heater controller 526 receives information regarding the operating temperatures on chip 520 from detectors 528. Detectors 528 represent portions of the integrated circuit design of chip 520 that operate to detect the operating temperature of an area of the chip that is proximate to the detector.

Heater controller 526 further operates to activate one or more of chip heaters 524 based upon the operating temperature information received from detectors 528. In this embodiment, heater controller 526 activates chip heaters 524 based upon the temperature differences between areas of chip 520, as determined by combining the operating temperature information from two or more detectors. For example, heater controller 526 can include a temperature difference circuit to determine when a temperature between pairs of detectors is greater than a temperature difference threshold and to activate chip heaters 524 when the temperature difference exceeds the temperature difference threshold. As such, FIG. 5 illustrates chip 520 as exhibiting a temperature profile represented by thermal regions 530, 532, and 534. Here, thermal region 530 represents an area of chip 520 that has a relatively higher temperature than thermal regions 532 and 534, thermal region 534 represents an area of the chip that has a relatively lower temperature than regions 530 and 532, and thermal region 532 represents an area of the chip that has a relatively medium temperature between the temperature of thermal region 530 and the temperature of thermal region 534. Here, chip heaters 524 are shown as being deactivated.

The skilled artisan will recognize that the performance of a particular circuit of an integrated circuit design will vary depending upon the temperature of the semiconductor material at the location of the particular circuit. Thus, given a particular circuit of the integrated circuit design that is instantiated at several locations within the integrated circuit design, the performance of a first instantiation of the circuit may be different from the performance of a second instantiation of the circuit if there is a temperature difference between the locations of the first and second instantiations of the circuit. As such, if the temperature difference between thermal regions 530, 532, and 534 are great enough, the performance differences between instantiations of similarly designed circuits within the different thermal regions may vary to a degree that is outside of a design limit. On the other hand, if the differences in the temperatures across chip 520 can be reduced, otherwise looser design limits within the integrated circuit design may be able to be tightened, allowing chip 520 to operate at higher or more persistent performance, or lower leakage, or both.

Figure 6:
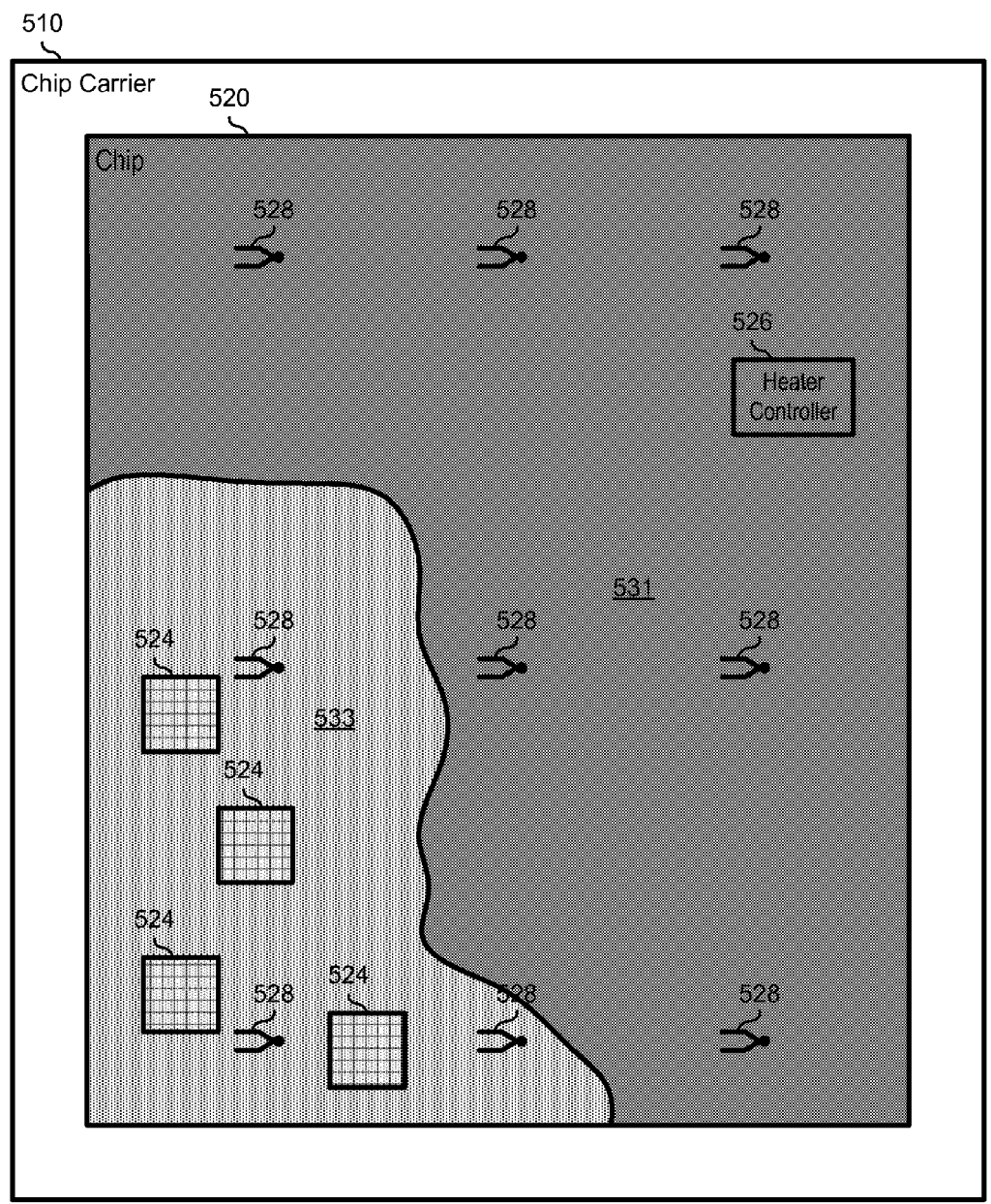

FIG. 6 illustrates integrated circuit device 500 where heater controller 526 has activated one or more of chip heaters 524, as indicated by the cross-hatch pattern in the chip heaters, in response to the information from detectors 528 that the temperatures between thermal regions 530, 532, and 534 varied widely. Here, chip heaters 524 operate to heat the areas of chip 520 that are proximate to the chip heaters. As such, the heat generated from chip heaters 524 is provided to chip 520 in addition to the heat generated by the other elements of the integrated circuit design that are also proximate to the chip heaters. In this way, the size of a lower temperature thermal region 533 is increased over the size of prior lower temperature thermal region 534, and the size of a higher temperature thermal region 531 is increased over the size of prior higher temperature thermal region 530. Thus the temperature difference between thermal regions 531 and 533 is decreased, and the performance of the circuits across chip 520 will be more uniform.

In a particular embodiment, an integrated circuit device or a 3D integrated circuit device can include a heater controller that controls the both the temperature gradient and the temperature difference across the chip. Further, the heater controller can operate to maintain a temperature gradient threshold and a temperature difference threshold across the chip, can operate to maintain a maximum or a minimum temperature across the chip, or can operate to provide other temperature related maintenance operations as needed or desired. In particular, the heater controller can operate in conjunction with, or as a part of an overall chip thermal controller that operates to keep the operating temperatures within the chip at or below certain thresholds, such as by manipulating clock speeds, power or voltage settings, clock gating, and other thermal control operations as known in the art. Here, maintaining a particular temperature gradient threshold or temperature difference threshold may involve taking steps to reduce the heat in one portion of the chip while taking other steps to increase the heat in another portion of the chip. An example of a temperature gradient threshold can be given as a temperature per distance, such as 1.2° C./mm. An example of a temperature difference threshold can be give as a temperature, such as 5.3° C.

Figure 7:
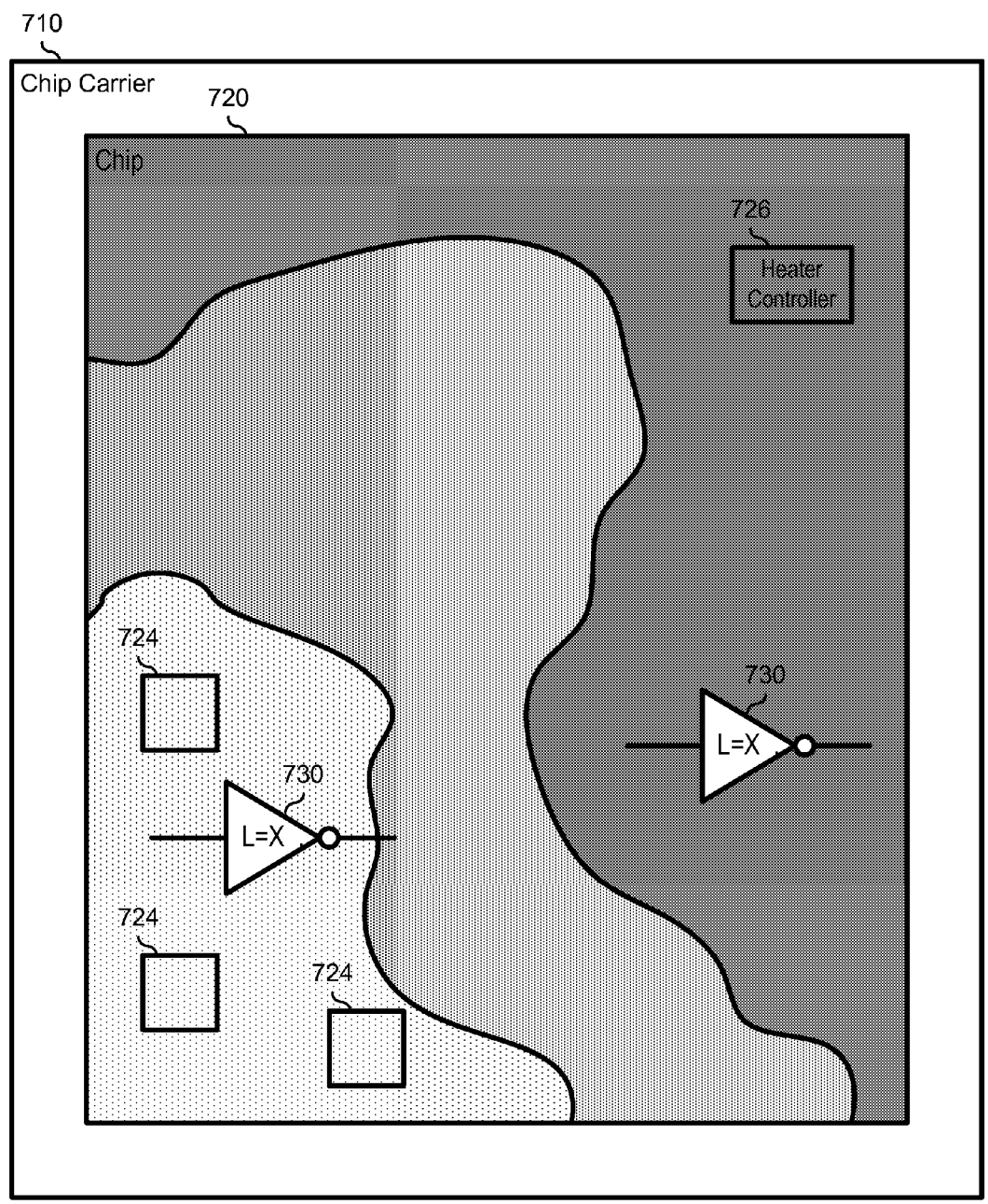
FIG. 7 illustrates an integrated circuit device with chip heaters and instantiations of a circuit, according to an embodiment of the present disclosure.

FIG. 7 illustrates an integrated circuit device 700, similar to integrated circuit devices 100 and 500, including a chip carrier 710 and an integrated circuit chip 720. Chip carrier 710 represents a package configured to provide a mechanical package for housing chip 720 and providing electrical connectivity between the chip and an external device or system configured to employ the functions and features of integrated circuit device 700. Chip 720 represents an integrated circuit configured to provide an electrical or electronic function to the external device or system. Chip 720 includes one or more chip heaters 724 and a heater controller 726. Chip 720 will be understood to include one or more detectors (not shown). Heater controller 726 operates to control the temperatures on chip 720 as described above.

Chip 720 also includes two or more instantiations of a circuit 730. Circuit 730 represents a common cell of the integrated circuit design of chip 720. Circuit 730 is illustrated as an inverter as an example, only, and circuit 730 can represent any cell of the integrated circuit design of chip 720 as needed or desired. Here, circuit 730 is laid out in the integrated circuit design such that the circuit is optimized to operate at the predicted worst case conditions on chip 720. For example, where a particular circuit performance parameter is worse at a lower temperature, and better at a higher temperature, then the cell layout of circuit 730 will be designed to as if all instantiations of the circuit were to be placed in lower temperature thermal regions. In this way, the instantiation of circuit 730 that is located in the lower temperature region will meet a design requirement for the particular parameter, while the instantiation of the circuit that is located in the higher temperature region will exceed the design requirement for the particular parameter. In terms of the cell layout of circuit 730, this translates into one or more dimensions of the cell having a particular length, shown as "L=X" in circuits 730. Note that, by optimizing the cell layout of circuit 730 for the lower temperature region, there may be many instantiations of the circuit that are located in hotter portions of chip 720 that are over-designed for the particular parameter, and that, in the aggregate, a significant portion of the real estate of the chip is wasted in order to accommodate the instantiations of the circuit that are located in cooler portions of the chip.

Figure 8:
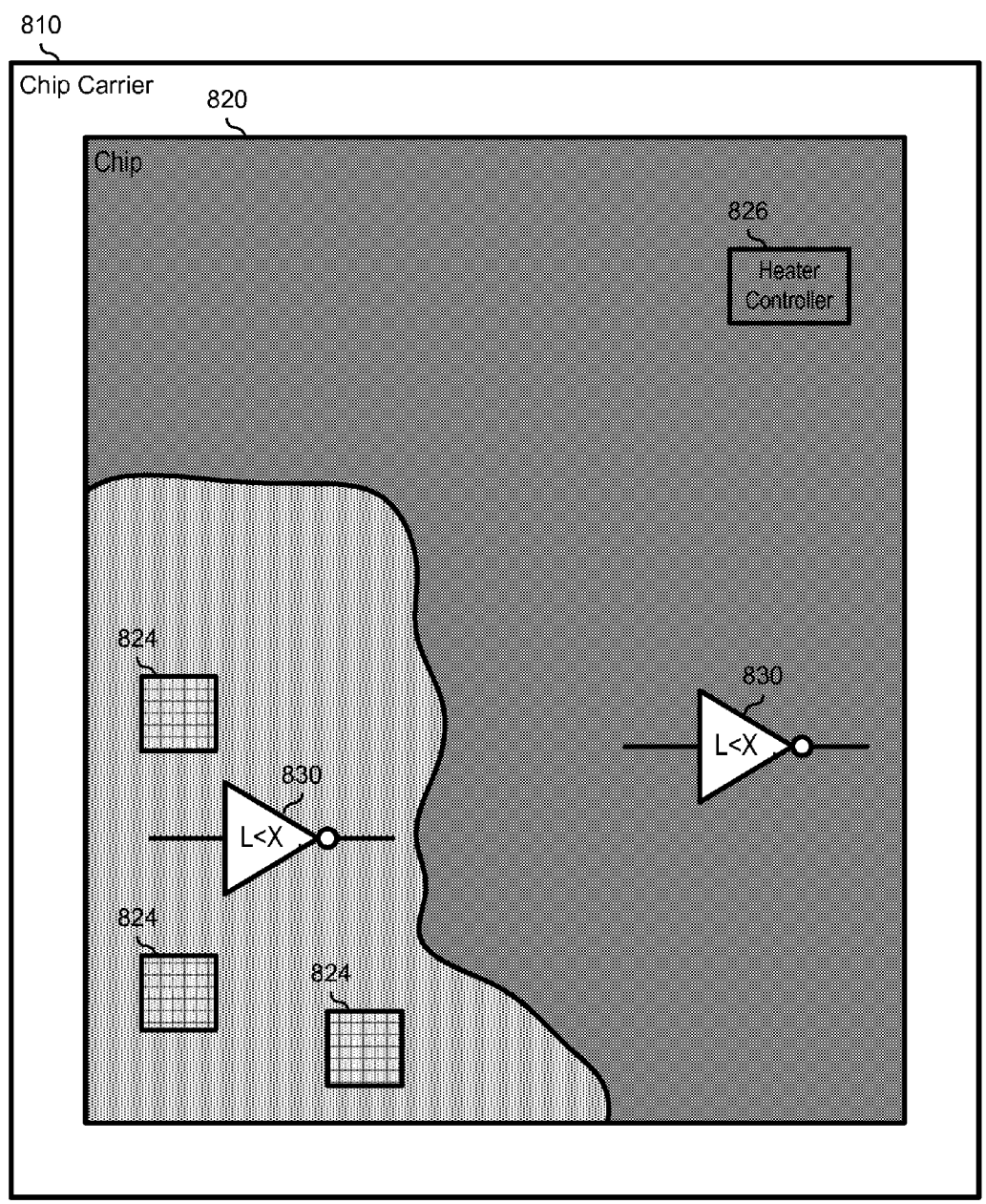
FIG. 8 illustrates an integrated circuit device with chip heaters and instantiations of a circuit, according to another embodiment of the present disclosure.

FIG. 8 illustrates an integrated circuit device 800, similar to integrated circuit devices 100, 500, and 700, including a chip carrier 810 and an integrated circuit chip 820. Chip carrier 810 represents a package configured to provide a mechanical package for housing chip 820 and providing electrical connectivity between the chip and an external device or system configured to employ the functions and features of integrated circuit device 800. Chip 820 represents an integrated circuit configured to provide an electrical or electronic function to the external device or system. Chip 820 includes one or more chip heaters 824 and a heater controller 826. Chip 820 will be understood to include one or more detectors (not shown). Heater controller 826 operates to control the temperatures on chip 820 as described above.

Chip 820 also includes two or more instantiations of a circuit 830. Circuit 830 represents a common cell of the integrated circuit design of chip 820. Circuit 830 is illustrated as an inverter as an example, only, and circuit 830 can represent any cell of the integrated circuit design of chip 820 as needed or desired. Here, circuit 830 is laid out in the integrated circuit design such that the circuit is optimized to operate at the predicted best case conditions on chip 820. For example, where a particular circuit performance parameter is worse at a lower temperature, and better at a higher temperature, then the cell layout of circuit 830 will be designed to as if all instantiations of the circuit were to be placed in higher temperature thermal regions. In this way, the instantiation of the circuit that is located in the higher temperature region will meet the design requirement for the particular parameter, while the instantiation of circuit 830 that is located in the lower temperature region will likely not meet a design requirement for the particular parameter. However, by locating one or more chip heaters 824 proximate to the instantiation of circuit 730 that is located in the lower temperature region, the circuit in the lower temperature region is heated, and the performance to the particular parameter is improved such that the circuit will meet the design requirement for the particular parameter. Here, in terms of the cell layout of circuit 830, this translates into one or more dimensions of the cell having a particular length that is less than the associated length of circuit 730 in FIG. 7, shown here as "L<X" in circuits 830. Note that, by optimizing the cell layout of circuit 830 for the higher temperature region and collocating chip heaters 824 with instantiations of the circuit that are located in cooler regions of chip 820, all instantiations of the circuit that are smaller, and a significant portion of the real estate of the chip is recovered over the embodiment of FIG. 7 where cell layouts are designed to accommodate the instantiations of the circuit that are located in cooler portions of the chip. In a particular embodiment, an amount of power that is saved in chip 820 by virtue of the smaller cell layout of circuit 830 may equal or exceed an amount of power consumed by cell heaters 824 to improve the performance of instantiations of circuit 830 that are located in cooler regions of chip 820.

Figure 9:
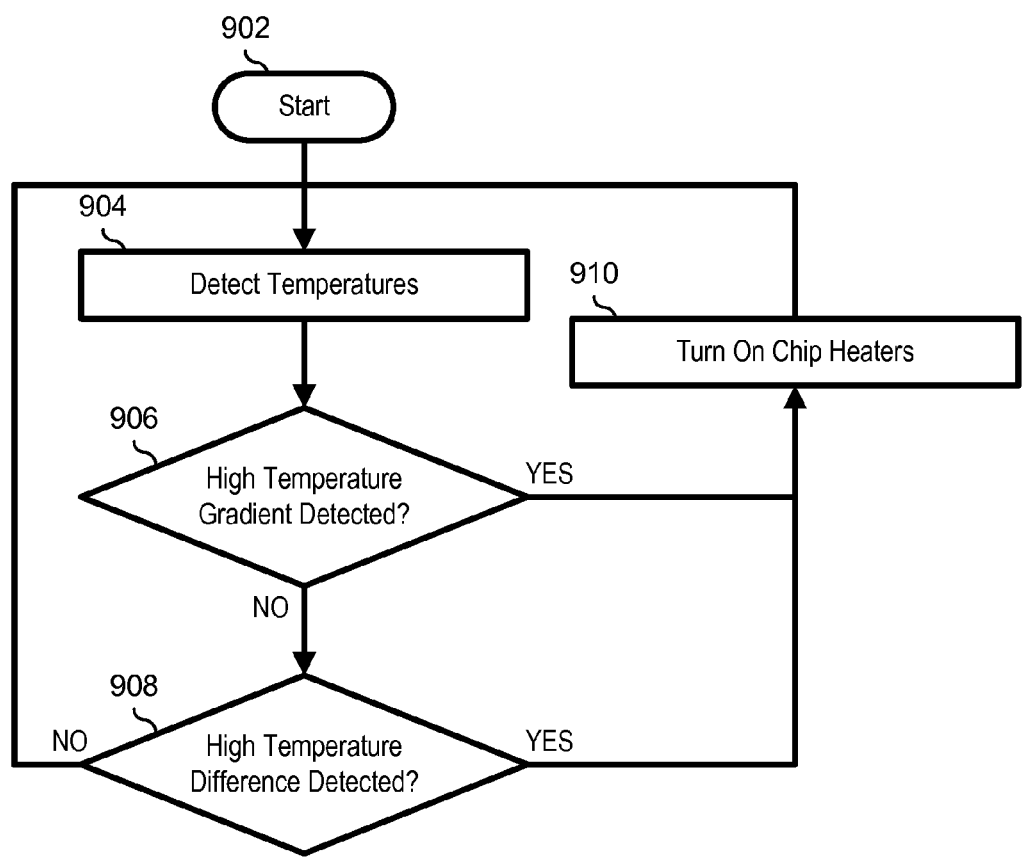
FIG. 9 is a flowchart illustrating a method of heating an integrated circuit device, according to an embodiment of the present disclosure.

FIG. 9 illustrates a method of heating an integrated circuit device, starting at block 902. The temperatures at various locations of an integrated circuit chip are detected in block 904. For example, detectors 128 and 129 can represent temperature sensors that directly detect the operating temperatures, or the detectors can operate, such as where the detectors represent thermocouples or other devices for directly detecting operating temperatures, or the detectors can operate to indirectly detect the operating temperatures, such as where the detectors represent power detectors that detect the power consumed by portions of the integrated circuit design of chip 120 that are proximate to the detectors, and heater controller 126 can correlate the detected power consumption from the detectors with the temperature of the respective portions of the chip.

A decision is made as to whether or not a high temperature gradient within the chip is detected in decision block 906. Here, the operating temperature information received from pairs of detectors 128 and 129 can be compared to determine temperature gradients across chip 120, as determined by combining the operating temperature information from a first detector 128 and one or more second detectors 129. In this way, a temperature profile represented by thermal regions 130, 132, and 134 is generated for chip 120. In a particular embodiment, the decision of decision block 906 includes a determination that a detected temperature gradient exceeds a temperature gradient threshold. If a high temperature gradient is detected, the "YES" branch of decision block 906 is taken, one or more chip heaters are turned on in block 910, and the method returns to block 904 where the temperatures at various locations of an integrated circuit chip are re-detected. For example, heater controller 126 can operate to activate one or more of chip heaters 124 based upon the operating temperature information received from pairs of detectors 128 and 129.

If a high temperature gradient is not detected in decision block 906, the "NO" branch of the decision block is taken and a decision is made as to whether or not a high temperature difference across the chip is detected in decision block 908. For example, the operating temperature information received from detectors 528 can be compared to determine the temperature differences across chip 520, as determined by determining a high operating temperature and a low operating temperature on the chip. In this way, a temperature profile represented by thermal regions 530 and 532 is generated for chip 520. If a high temperature difference across the chip is detected, the "YES" branch of decision block 908 is taken, one or more chip heaters are turned on in block 910, and the method returns to block 904 where the temperatures at various locations of an integrated circuit chip are re-detected. For example, heater controller 526 can operate to activate one or more of chip heaters 524 based upon the operating temperature information received from detectors 528. If a high temperature difference across the chip is not detected, the "NO" branch of decision block 908 is taken and the method returns to block 904 where the temperatures at various locations of an integrated circuit chip are re-detected.

Figure 10:
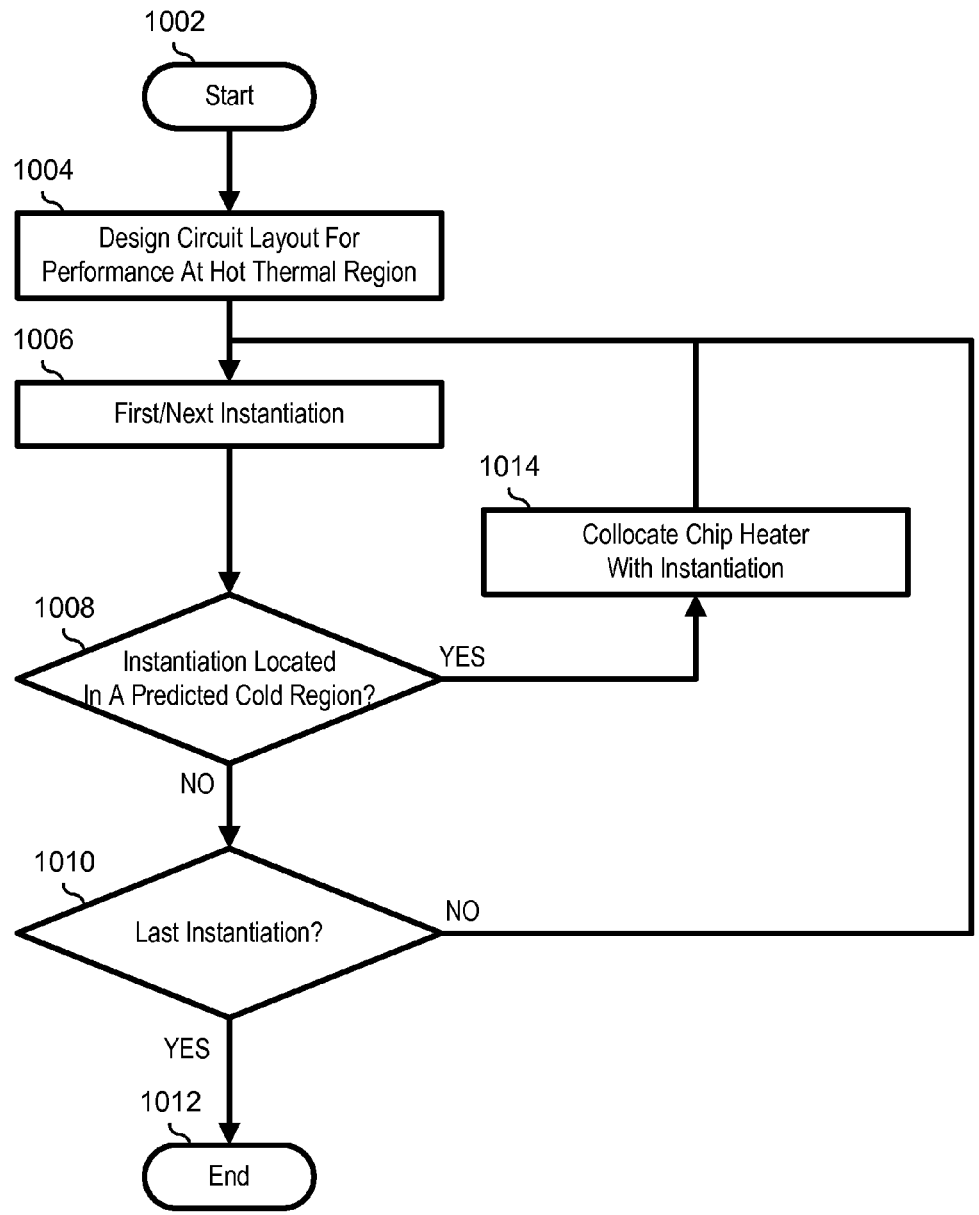
FIG. 10 is a flowchart illustrating a method of placing circuits in an integrated circuit device with chip heaters, according to an embodiment of the present disclosure.

FIG. 10 illustrates a method of placing circuits in an integrated circuit device with chip heaters, starting at block 1002. A layout for a circuit of an integrated circuit design is laid out for optimum performance in hot thermal regions of an integrated circuit chip in block 1004. For example, a circuit 830 can be optimized for optimum performance in a high thermal region of chip 820. A first instantiation of the circuit of the integrated circuit design is selected in block 1006. For example, one of circuits 830 can be selected to initiate the method.

A decision is made as to whether or not the selected circuit instantiation is located in a thermal region of the chip that is predicted to be a colder thermal region in decision block 1008. If so, the "YES" branch of decision block 1008 is taken, a chip heater is collocated with the circuit instantiation in block 1014, and the method returns to block 1006 where a next instantiation of the circuit of the integrated circuit design is selected. For example, where circuit 830 is located in a colder thermal region of chip 820, chip heater 824 can be located proximate to the circuit in order to heat the circuit to obtain better performance from the circuit.

If the selected circuit instantiation is not located in a thermal region of the chip that is predicted to be a colder thermal region in decision block 1008, the "NO" branch of the decision block is taken, and a decision is made as to whether or not the selected circuit instantiation is a last instantiation of the circuit in the integrated circuit design in decision block 1010. If so, the "YES" branch of decision block 1010 is taken and the method ends in block 1012. If not, the "NO" branch of decision block 1010 is taken and the method returns to block 1006 where a next instantiation of the circuit of the integrated circuit design is selected.

In a first embodiment of the present disclosure, an integrated circuit chip includes a first detector to provide first temperature information at a first location, a chip heater to provide heat to the integrated circuit chip at the first location, and a heater controller to receive the first temperature information and to activate the chip heater in response to the first temperature information. The chip heater can be a passive element of the integrated circuit chip, and the passive element can include one or more of a resistor and an inductor. The chip heater can also be an active circuit of the integrated circuit chip, and the circuit can include one or more of a switched capacitor circuit, a dummy counter circuit, and a dummy clock tree circuit.

In a variant of the first embodiment, the integrated circuit chip further includes a second detector to provide second temperature information at a second location and the heater controller is further to receive the second temperature information. The heater controller can determine a temperature gradient based on the first temperature information and the second temperature information, and determine that the temperature gradient is greater than a threshold, where activating the chip heater is in further response to determining that the temperature gradient is greater than the threshold. The heater controller can also determine a temperature difference based on the first temperature information and the second temperature information, and determine that the temperature difference is greater than a threshold, where activating the chip heater is in further response to determining that the temperature difference is greater than the threshold.

In other variants of the first embodiment, the first detector can include a temperature sensor or the first detector can also include a power detector.

In still other variants of the first embodiment, in activating the chip heater, the chip heater operates to: reduce stress in a semiconductor material of the integrated circuit chip; reduce stress in a chip lead of the integrated circuit chip, the chip lead being to connect the integrated circuit chip to a chip carrier; and improve a performance characteristic of a circuit of the integrated circuit chip.

In a second embodiment of the present disclosure, a three-dimensional (3D) integrated circuit device includes a first integrated circuit chip having a detector to provide first temperature information at a first location, having a chip heater to provide heat to the first integrated circuit chip at the first location, and a heater controller to receive the first temperature information and to activate the chip heater in response to the first temperature information, and having a second integrated circuit chip, where the chip heater is further to provide heat to the second integrated circuit chip. The chip heater can be a passive element of the integrated circuit chip, and the chip heater can also be an active circuit of the integrated circuit chip.

In a variant of the second embodiment, the detector includes at least one of a temperature sensor and a power detector. In other variants of the second embodiment, in activating the chip heater, the chip heater operates to: reduce stress in a semiconductor material of the first integrated circuit chip; and reduce stress in a chip lead of the 3D integrated circuit chip, the chip lead being to connect the first integrated circuit chip to the second integrated circuit chip.

In a third embodiment of the present disclosure, a method includes designing a layout of an integrated circuit device to have a performance characteristic that is optimized at a first temperature, laying out an integrated circuit chip where the integrated circuit chip includes an instantiation of the integrated circuit device at a location on the integrated circuit chip, determining a predicted operating temperature at the location, and laying out a chip heater on the integrated circuit device in response to determining that the predicted operating temperature is less than the first temperature, the chip heater being located to heat the instantiation of the integrated circuit device to a second temperature, where the second temperature is closer to the first temperature than the predicted operating temperature.

Based upon the description herein, it will be appreciated that the preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A device comprising:
    a first detector, comprising an output, disposed at a first location of an integrated circuit chip and configured to determine a first temperature information;
    a first instantiation of a circuit of the integrated circuit chip, disposed at the first location;
    a second detector, comprising an output, disposed at a second location of the integrated circuit chip and configured to determine a second temperature information;
    a second instantiation of the circuit, disposed at the second location;
    a chip heater, comprising an input to receive a control signal, disposed at the second location of the integrated circuit and configured to heat the second location to change a performance characteristic of the second instantiation to match the performance characteristic of the first instantiation, based upon the control signal; and
    a heater controller comprising a first input coupled to the output of the first detector to receive the first temperature information, a second input coupled to the output of the second detector to receive the second temperature information, and an output coupled to the input of the chip heater, the heater controller configured to generate the control signal based upon a temperature difference between the first temperature information and the second temperature information.

2. The integrated circuit chip of claim 1, wherein the chip heater comprises a passive element of the integrated circuit chip.

3. The integrated circuit chip of claim 2, wherein the passive element comprises one of a resistor of the integrated circuit chip and an inductor of the integrated circuit chip.

4. The integrated circuit chip of claim 1, wherein the chip heater comprises an active circuit of the integrated circuit chip.

5. The integrated circuit chip of claim 4, wherein the active circuit comprises one of a switched capacitor circuit, a dummy counter circuit, and a dummy clock tree circuit.

6. The integrated circuit chip of claim 1, further comprising:
    a third detector, comprising an output, disposed at a third location of the integrated circuit chip and configured to determine a third temperature information, wherein the area includes the third location;
    wherein the heater controller further comprises a third input coupled to the output of the third detector to receive the third temperature information.

7. The integrated circuit chip of claim 6, wherein the heater controller comprises a temperature gradient circuit including:
    a first input to receive the first temperature information;
    a second input to receive the third temperature information; and
    logic to determine a temperature gradient based on the first temperature information and the third temperature information, and to determine when the temperature gradient is greater than a threshold, wherein generating the control signal is in response to determining that the temperature gradient is greater than the threshold.

8. The integrated circuit chip of claim 6, wherein the heater controller comprises a temperature difference circuit including:
    a first input to receive the first temperature information;
    a second input to receive the second temperature information; and
    logic to determine the temperature difference based on the first temperature information and the second temperature information, and to determine when the temperature difference is greater than a threshold, wherein generating the control signal is in response to determining that the temperature difference is greater than the threshold.

9. The integrated circuit chip of claim 1, wherein the first detector comprises a temperature sensor.

10. The integrated circuit chip of claim 1, wherein the first detector comprises a power detector.

11. The integrated circuit chip of claim 1, wherein the heater controller is configured to generate the control signal to reduce physical stress in a semiconductor material of the integrated circuit chip.

12. The integrated circuit chip of claim 1, wherein the heater controller is configured to generate the control signal to reduce stress in a chip lead of the integrated circuit chip.

13. The integrated circuit chip of claim 1, wherein the heater controller is configured to generate the control signal to improve the performance characteristic of the circuit.

14. A device comprising:
    a first integrated circuit chip attached to a chip carrier, the first integrated circuit having:

a detector, comprising an output, disposed at a first location of the first integrated circuit chip and configured to determine a first temperature information;

a chip heater, comprising an input to receive a control signal, disposed at a second location of the first integrated circuit and configured to heat a first area of the first integrated circuit device that includes the first location and the second location, based upon the control signal; and a heater controller comprising a first input coupled to the output of the first detector to receive the first temperature information, and an output coupled to the input of the chip heater, the heater controller configured to generate the control signal based upon the first temperature information; and a second integrated circuit chip stacked with the first integrated circuit chip, wherein the chip heater is further configured to heat a third location of the second integrated circuit device.

15. The device of claim 14, wherein the chip heater comprises a passive element of the first integrated circuit chip.

16. The device of claim 14, wherein the chip heater comprises a circuit of the first integrated circuit chip.

17. The device of claim 14, wherein the detector comprises at least one of a temperature sensor and a power detector.

18. The device of claim 14, wherein the heater controller is configured to generate the control signal to reduce physical stress between the first integrated circuit chip and the second integrated circuit chip.

19. The device of claim 14, wherein the heater controller is configured to generate the control signal to reduce stress in a chip lead between the first integrated circuit chip and the second integrated circuit chip.

20. A method comprising:

determining, by a first detector of an integrated circuit chip disposed at a first location, first temperature information;

locating, at the first location, a first instantiation of a circuit of the integrated circuit;

providing, by the first detector, the first temperature information to a heater controller of the integrated circuit device;

determining, by a second detector of the integrated circuit clip disposed at a second location, second temperature information;

locating, at the second location, a second instantiation of the circuit;

providing, by the second detector, the second temperature information to the heater controller;

generating, by the heater controller a control signal based upon a temperature difference between the first temperature information and the second temperature information; and heating, by a chip heater of the integrated circuit device disposed at the second location the second instantiation to change a performance characteristic of the second instantiation to match the performance characteristic of the first instantiation in response to the control signal.

* * * * *